United States Patent [19]

Heller et al.

[11] 3,789,312

[45] Jan. 29, 1974

[54] THRESHOLD INDEPENDENT LINEAR AMPLIFIER

[75] Inventors: Lawrence G. Heller, Essex Junction; Norbert G. Vogel, Jr., Colchester, both of Vt.

[73] Assignee: International Business Machines Corporation, Armonk, N.Y.

[22] Filed: Apr. 3, 1972

[21] Appl. No.: 240,561

[52] U.S. Cl. .................... 330/35, 307/205, 307/304

[51] Int. Cl. .............................................. H03f 3/16

[58] Field of Search ....... 330/35; 307/205, 251, 304

[56] References Cited

UNITED STATES PATENTS

| | | | |
|---|---|---|---|
| 3,702,945 | 11/1972 | Faith et al. | 307/304 X |
| 3,581,292 | 5/1971 | Polkinghorn | 307/304 X |
| 3,675,144 | 7/1972 | Zuk | 330/35 X |

*Primary Examiner*—Herman Karl Saalbach
*Assistant Examiner*—James B. Mullins
*Attorney, Agent, or Firm*—Francis J. Thornton

[57] ABSTRACT

Low level pulses in the order of 100 millivolts or less can be detected and amplified regardless of variations in the voltage required to turn on the active device used in the amplifier. This is achieved by coupling an active device between a capacitor and a capacitively loaded output line, charging the output line to a reference voltage, applying a level setting voltage to the device to turn on the device; charging the capacitor to a voltage substantially equivalent to the level setting voltage to turn off the device while maintaining it such that any input signal superimposed on the level setting voltage will cause the device to again turn on and discharge the capacitively loaded output line thereby amplifying and inverting the superimposed input signal.

The invention is particularly useful for sensing random access integrated semiconductor memories.

The invention may be employed in either bipolar or field effect transistor technologies.

12 Claims, 2 Drawing Figures

THRESHOLD INDEPENDENT LINEAR AMPLIFIER

BACKGROUND OF THE INVENTION

1. Field of the Invention

This invention relates generally to small signal amplifiers.

The invention further relates to amplifiers which compensate for turn on or threshold voltage variations in the amplifying device, especially when the amplifying device is a semiconductor.

2. Description of the Prior Art

Amplifiers using Field Effect Transistors as the active elements are known to the prior art. For example, U.S. Pat. No. 3,286,189 teaches that a Field Effect Transistor (FET) can be a signal amplifying device and it can have its gain increased by loading it with another FET which substitutes for the conventional resistor load.

U.S. Pat. No. 3,564,290 describes a logic circuit utilizing FET devices having a capacitor coupled between the gate and source of an FET to cause the potential at the gate to follow the potential at the source. With the charge of the capacitor controlled to render the FET conductive or non-conductive so that small supply voltages may be used in the operation of the circuit.

U.S. Pat. No. 3,268,827 describes a Field Effect Transistor amplifier which is operable to high gain without signal distortion by connecting the Field Effect Transistor as a gate input, common-source amplifier and a second FET connected as a source input, common-gate amplifier, thus providing a cascade amplifier circuit employing Field Effect Transistors as the active elements in both the output and input stages of the amplifier.

SUMMARY OF THE INVENTION

It is an object of the invention to provide an improved amplifier.

It is also an object of the invention to provide a novel amplifier circuit for detecting and amplifying small signals.

It is a further object of the invention to create an amplifier circuit that is independent of the turn on voltage of the active device used in the amplifier.

It is still a further object of the invention to provide an amplifier whose output is linear and related to its input, thus achieving linear gain.

It is an additional object of the invention to provide an amplifier circuit for small signals that will operate with linear gain regardless of process variation during the creation of the semiconductor device used as the active amplifying element.

It is still another object of the invention to provide an amplifier employing semiconductors that is easily and readily fabricated and is compatible with known solid state integrated circuit technologies and techniques.

These and other objects of the invention are particularly realized in a circuit for detecting and amplifying small signals. The circuit that accomplishes this comprises an active amplifying semiconductor device connected between a capacitor and a capacitively loaded output line coupled to a reference voltage source. The active device has its control element coupled to a level setting voltage and a signal input source. When the level setting voltage is impressed on the control element, the device turns on to connect the capacitor to the output line and the reference voltage source, thereby charging the capacitor to a voltage equal to the level setting voltage impressed on the control less the threshold voltage of the device; such that, when an additional input signal from the source is superimposed on the level setting voltage impressed on the control element, the output line is caused to discharge thereby producing an amplified output signal.

The foregoing and other objects, features and advantages of the invention will be apparent from the following more particular detailed description of a preferred embodiment of the invention as illustrated in the accompanying drawing.

DESCRIPTION OF THE PREFERRED EMBODIMENT

Figure 1:
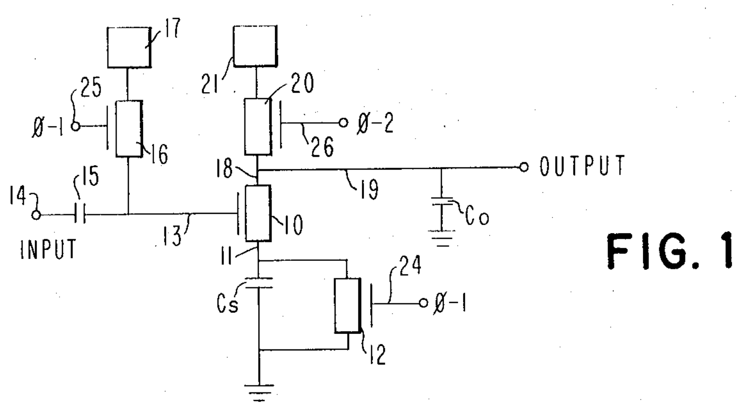
FIG. 1 illustrates an embodiment of the invention employing a Field Effect Transistor as the active device.
Figure 2:
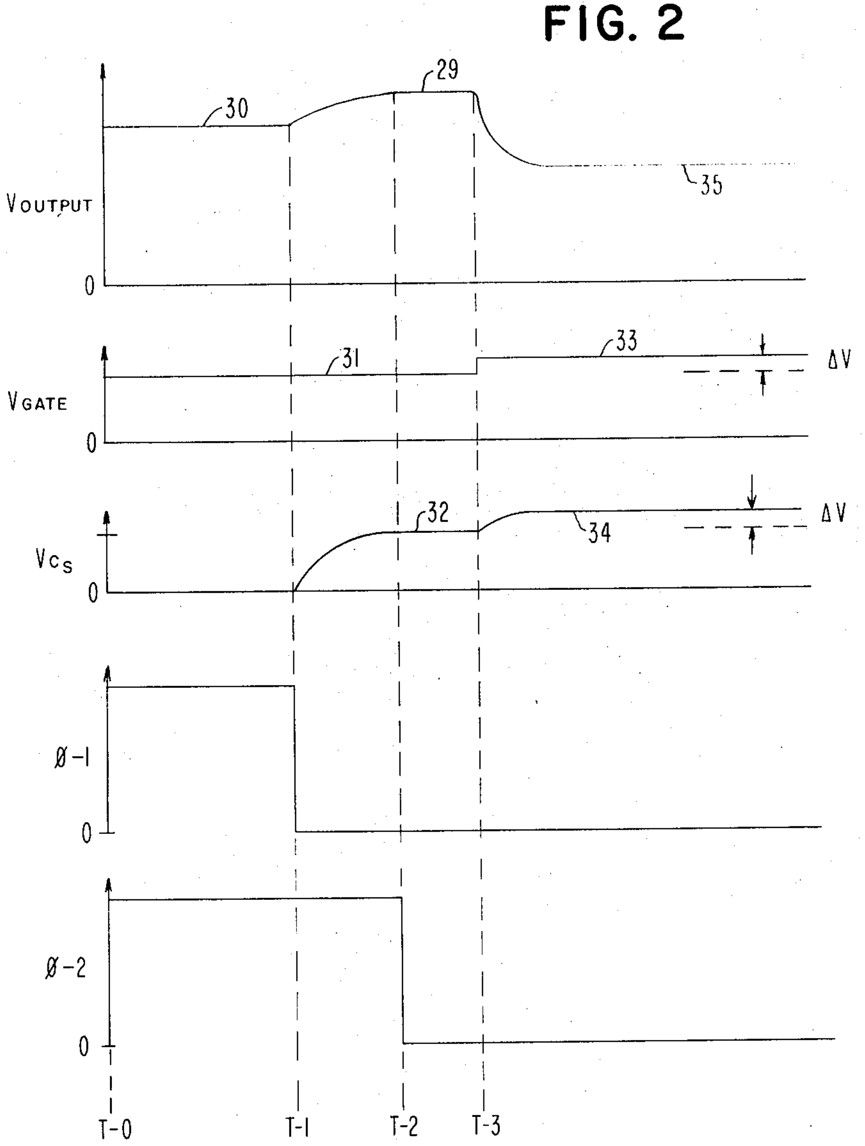
FIG. 2 illustrates the voltage wave forms realized at various points and times during the operation of the circuit of the present invention.

Referring now to the drawing and more particularly to FIGS. 1 and 2, the principles of the inventive concept of the present invention as contained in one specific embodiment will be described in detail.

In keeping with conventional Field Effect Transistor (FET) technology in the following description the element or electrode of the FET closest to ground will be referred to as the source or carrier supplying terminal, while the most highly biased electrode; that is, the electrode biased furthest from ground will be considered the drain or carrier receiving terminal; and, the third element which controls the switching on or off of the FET will be referred to as the gate.

The threshold independent linear amplifier of the invention is schematically illustrated in FIG. 1 and incorporates all the principle features of the invention. It will be assumed in the figure that all of the FET's as shown here are so-called N-Channel FET's. In this figure the amplifying FET 10 is shown as having its source 11 coupled through a storage capacitor Cs and a second FET 12 to ground. Its gate electrode 13 is coupled to an input 14 through a D.C. blocking capacitor 15 and through an FET 16 to a positive reference voltage source 17.

The drain 18 of FET 10 is connected to an output line 19 which is coupled through an FET 20 to a positive voltage source 21 and through an equivalent load capacitor Co to ground.

The gates 24 and 25 of FET's 12 and 16, respectively, are both connected to a clock synchronizing pulse supply $\phi$—1 (not shown), while the gate 26 of FET 20 is connected to a different clock synchronizing pulse supply $\phi$—2 (not shown).

For purposes of illustration only, the FET's described will be presumed to be N-Channel devices having a width to length ratio of 1, a mobility of about 400 cm/volt-sec, a threshold voltage of about 1 volt, and an FET transconductance of about 30 micromhos/volt. With such devices the size of the capacitor Cs, preferably has a value of 10 picofarads and capacitor Co has a value of about 0.5 picofarads. The voltage source 21 is a positive voltage supply of approximately 10 volts, while the voltage reference source 17 is a positive voltage supply of approximately 4 volts. The pulses emitted by both the clock synchronizing pulse supplies $\phi$—1 and $\phi$—2 should be approximately 12 volts. The circuit of the invention using the described components will thus amplify positive input signals.

The operation of the circuit of FIG. 1 will be described in conjunction with the voltages illustrated in FIG. 2 as follows: at time T-O transistors 12 and 16 are turned on by application of the clock pulse $\phi$—1 to their gates and transistor 20 is also turned on because clock pulse $\phi$—2 is applied to its gate. The clock pulses are set at relatively high voltage levels to assure that these transistors 12, 16 and 20 are not in saturation.

When transistor 20 turns on, the supply voltage from source 21, in this case + 10 volts, is applied to the output line 19 causing it to rise to a positive value as shown by curve 30 of FIG. 2 to charge capacitor Co. When transistor 12 turns on, it discharges capacitor Cs and when transistor 16 turns on, the gate 13 of FET 10 becomes biased at the reference voltage supplied by source 17, as shown by curve 31 of FIG. 2. For the described components gate 13 is at about 4 volts when the reference voltage from source 17 is 4 volts. This voltage on gate 13 causes gate 13 to be more positive than source 11 by at least one threshold voltage and less positive than the drain voltage, thus FET 10 is turned on and is conducting in the saturation region.

At time T-1 clock pulse $\phi$—1 is reduced to ground causing transistors 12 and 16 to turn off. Because the gate 13 is isolated by the input blocking capacitor 15, the gate remains at the reference voltage even though it is now disconnected from the reference source 17 by the turning off of transistor 16. Thus gate 13 continues to be more positive than source 11 by more than one threshold voltage and FET 10 remains in a conductive state. When transistor 12 turns off, capacitor Cs begins charging towards a voltage corresponding to the voltage applied to gate 13 (4 volts) less the threshold voltage of transistor 10 (about 1 volt). Capacitor Co correspondingly charges to the full voltage of supply 21. This charging of capacitor Cs is shown by curve 32 in FIG. 2 and capacitor Co by curve 29.

When Cs reaches this voltage; i.e., the applied gate voltage (4 volts) less the threshold voltage (about 1 volt) of transistor 10, transistor 10 becomes turned off because gate 13 is no longer more positive than source 11 by more than one threshold voltage. At some time T-2, after capacitor Cs becomes fully charged, clock pulse $\phi$—2 is reduced to ground leaving the output line 19 and capacitor Co fully charged. Line 19 and capacitor Co remain charged because they are isolated from the power supply 21 by transistor 20 and from capacitor Cs by transistor 10.

The circuit remains in this steady state condition with transistor 10 being ready to turn on any time the voltage applied to gate 13 increases.

At time T-3 a small input pulse ΔV of say approximately 100 is applied to the input 14. This small input pulse may be, for example, an output pulse from a random access, integrated semiconductor memory (not shown). This input pulse appears as an increase in voltage superimposed on the gate voltage curve 31 and is shown by curve 33. This voltage increase on gate 13 of transistor 10 causes the transistor 10 to again become conductive. Transistor 10 becomes conductive because the gate voltage again is more positive than the source voltage plus threshold.

When transistor 10 switches on, capacitor Cs begins again to rise towards the more positive gate 13. This is shown by curve 34 imposed on curve 32 of FIG. 2.

Since capacitor Cs is approximately 20 times larger (10pf) than capacitor Co (0.5pf) capacitor Co is greatly discharged causing the output line 19 to drop proportionately. That is, the output voltage change = input signal voltage (Cs/Co).

For the example given above where Cs = 10pf, Co = 0.5pf and the input signal is 100mv, the output line change would be 2000mv. Thus the input signal has been inverted and amplified by a factor of 20.

Once an input signal has been amplified, the circuit must be reset by again introducing the clock pulses $\phi$—1 and $\phi$—2 onto the gates of transistors 12, 16 and 20 and repeating the cycle discussed above.

By setting the charge on capacitor Cs as described, the circuit will operate even though FET devices having different threshold voltages are substituted for the amplifying transistor 10.

It should also be apparent to those skilled in the art that P-Channel Field Effect Transistors can also be used. In such a case it is necessary that the applied voltages be reversed in polarity.

Although the invention has been described as using Field Effect Transistors, it is also operable using PNP and NPN bipolar transistors as substitutions for the described FET devices.

While the invention has been particularly shown and described with reference to a preferred embodiment thereof, it will be understood by those skilled in the art that various changes in form and detail may be made therein without departing from the spirit or scope of the invention.

What is claimed is:

1. An amplifier circuit comprising, a three terminal device having a control terminal, a carrier supplying terminal, a carrier receiving terminal and a threshold voltage, a first capacitor having a given capacitive value coupled to the carrier supplying terminal the carrier receiving terminal being coupled to a capacitive load having a capacitive value substantially less than said given value, a reference voltage source means for charging said load and said first capacitor, impedance means coupled between said reference voltage source means and said carrier receiving terminal, means for applying a level setting voltage on the control terminal to charge the first capacitor to a voltage equal to the level setting voltage less the threshold voltage of the device, means for applying a signal voltage on the level setting voltage to turn on the device for discharging said capacitive load through said device to said first capacitor, and an output terminal coupled to the carrier receiving terminal.

2. The amplifier circuit of claim 1 wherein there is further provided means for discharging the capacitor.

3. The amplifier circuit of claim 1 wherein said three terminal devices comprises a Field Effect Transistor.

4. The amplifier circuit of claim 1 wherein said impedance means comprises a transistor switch between said carrier receiving terminal and said voltage source to selectively isolate the terminal from the voltage source.

5. An amplifier circuit for compensating for turn-on voltage variations in transistors comprising, a transistor having a control electrode, a carrier supplying electrode, a carrier receiving electrode, and a threshold voltage between said control electrode and said carrier supplying electrode that must be exceeded to place said transistor in a conductive state, a first capacitor coupled between the carrier supplying electrode and ground, a second capacitor coupled to the carrier receiving electrode, a fixed voltage source coupled to the carrier receiving electrode and the second capacitor, means for applying a voltage greater than said threshold voltage on said control electrode for impressing a voltage from said fixed source across the first capacitor to bias the supplying electrode to one threshold voltage below the control electrode, means for decoupling said fixed voltage source from said carrier receiving terminal and said second capacitor, means reactively coupled to the control element for applying an input signal on said voltage on said control electrode, terminal means on the carrier receiving terminal at which the amplified signal may be detected, said signal being amplified proportional to the ratio of the first capacitor to the second capacitor, and means for discharging the first capacitor.

6. An amplifier circuit comprising, a device having first and second terminals and a control terminal a capacitor coupled to said first terminal, a capacitive load coupled to said second terminal, means for applying a given control voltage to said control terminal, means for selectively charging said capacitive load to a predetermined voltage and for charging said capacitor through said device, to a voltage sufficient to turn off said device, and means for adding an input signal voltage to the given control voltage on said control terminal of said device to turn on said device for discharging said capacitive load through said device to said capacitor.

7. An amplifier circuit as set forth in claim 6 wherein said device has a given threshold voltage and said given control voltage has a magnitude greater than that of said given threshold voltage.

8. An amplifier circuit as set forth in claim 7 wherein said predetermined voltage has a magnitude substantially greater than that of said control voltage 9. An amplifier circuit as set forth in claim 6 wherein the capacitance of said capacitive load has a magnitude substantially less than that of said capacitor.

10. An amplifier circuit as set forth in claim 9 wherein the magnitude of the capacitance of said capacitive load is approximately one-twentieth of that of said capacitor.

11. An amplifier as set forth in claim 6 further including means for selectively discharging said capacitor.

12. An amplifier as set forth in claim 6 wherein said charging means includes a source of potential and switching means for selectively coupling said source to said second terminal.

* * * * *